United States Patent [19]

Gardner

[11] 4,128,879
[45] Dec. 5, 1978

[54] RECIRCULATING MEMORY WITH PLURAL INPUT-OUTPUT TAPS

[75] Inventor: Harry N. Gardner, Colorado Springs, Colo.

[73] Assignee: Motorola, Inc., Schaumburg, Ill.

[21] Appl. No.: 862,260

[22] Filed: Dec. 20, 1977

Related U.S. Application Data

[63] Continuation of Ser. No. 709,750, Jul. 29, 1976, abandoned.

[51] Int. Cl.$^2$ .................. G11C 21/00; G11C 19/28
[52] U.S. Cl. .................. 365/73; 307/DIG. 5; 364/900; 365/183; 365/236
[58] Field of Search ............ 365/73, 75, 183, 236, 365/239, 240, 233; 307/207, 220, DIG. 5; 364/200 MS File, 900 MS File

[56] References Cited

U.S. PATENT DOCUMENTS

| | | | |
|---|---|---|---|
| 3,141,153 | 7/1964 | Klein | 365/73 |
| 3,760,382 | 9/1973 | Itoh | 365/73 X |
| 3,891,977 | 6/1975 | Amelio et al. | 365/183 |
| 3,962,689 | 6/1976 | Brunson | 365/239 |
| 4,027,288 | 5/1977 | Barton et al. | 364/200 |

Primary Examiner—Bernard Konick
Assistant Examiner—Donald McElheny
Attorney, Agent, or Firm—Walter W. Nielsen

[57] ABSTRACT

A CCD (charge coupled device) RAM (random access memory) includes a plurality of "rings" of serially connected CCDs in which digital information recirculates. A combinational decoder selects one of the plurality of rings by decoding a first group of binary address inputs. Each ring includes a plurality of input/output circuits coupled to associated "taps", each tap being coupled between an input and an output of a CCD regeneration cell. An address addition circuit includes a counter which counts at the same rate that data shifts through each of the rings and has a plurality of taps spaced at the same intervals (numbers of intervening CCD cells) as the taps in each of the rings. The counter outputs are decoded to provide a first internal address corresponding to the location of a fictitious tag bit in a ring with reference to an initial reference bit in a ring.

16 Claims, 5 Drawing Figures

RECIRCULATING MEMORY WITH PLURAL INPUT-OUTPUT TAPS

This is a continuation of application Ser. No. 709,750, filed July 29, 1976, now abandoned.

BACKGROUND OF THE INVENTION

Charge coupled devices (CCDs) have been utilized as solid state shift registers for a number of years. See, for example the article appearing in the June 21, 1971, issue of *ELECTRONICS MAGAZINE* on pages 50–59.

For CCDs, as well as other types of recirculating memories, such as delay lines, information is generally read out sequentially at a particular tap point, or else an entire word of data is read out in parallel from a plurality of adjacent tap points. In either case, the user has to wait for the data to reach the fixed tap point or tap points, and circuitry must be provided to keep track of the time at which the addressed information is available at the tap point or tapped points. Consequently, it has generally been impractical to implement random access memories using serial memory devices, especially CCDs.

SUMMARY OF THE INVENTION

It is an object of this invention to provide a random access memory having serially coupled memory cells.

It is another object of the invention to provide a random access memory having a plurality of rings of serially coupled memory cells, each of the rings having spaced taps and associated address circuitry for selecting one of the rings and one of the taps, and for producing a strobe signal enabling the addressed bit of information to be read out from a selected tap when the addressed information appears at that tap.

Briefly described, the invention is a random access memory including a plurality of sequentially coupled storage cells for recirculating data. The random access memory includes address circuitry for addressing any particular bit of data recirculating in the memory, and also includes circuitry for counting the number of memory cells through which the addressed bit has shifted from a reference storage cell and adding that number to a binary address corresponding to the addressed bit of data to produce an internal address corresponding to the actual physical location of the addressed bit of recirculating data. A decoder decodes the internal address corresponding to the actual physical location of the address bit and selects the actual physical location. In one embodiment, a plurality of rings of recirculating storage cells are provided, and decode means are provided to select one of the rings. Spaced taps are provided on each ring and tap select circuitry is provided to select the next tap at which the addressed bit of data will appear in each of the rings. A strobe circuit is provided to generate a read/write enable pulse to enable input/output circuitry associated with the selected tap to write data into or read data out of a selected tap at the time that the addressed bit is located at the selected tap.

DESCRIPTION OF THE INVENTION

Figure 1:
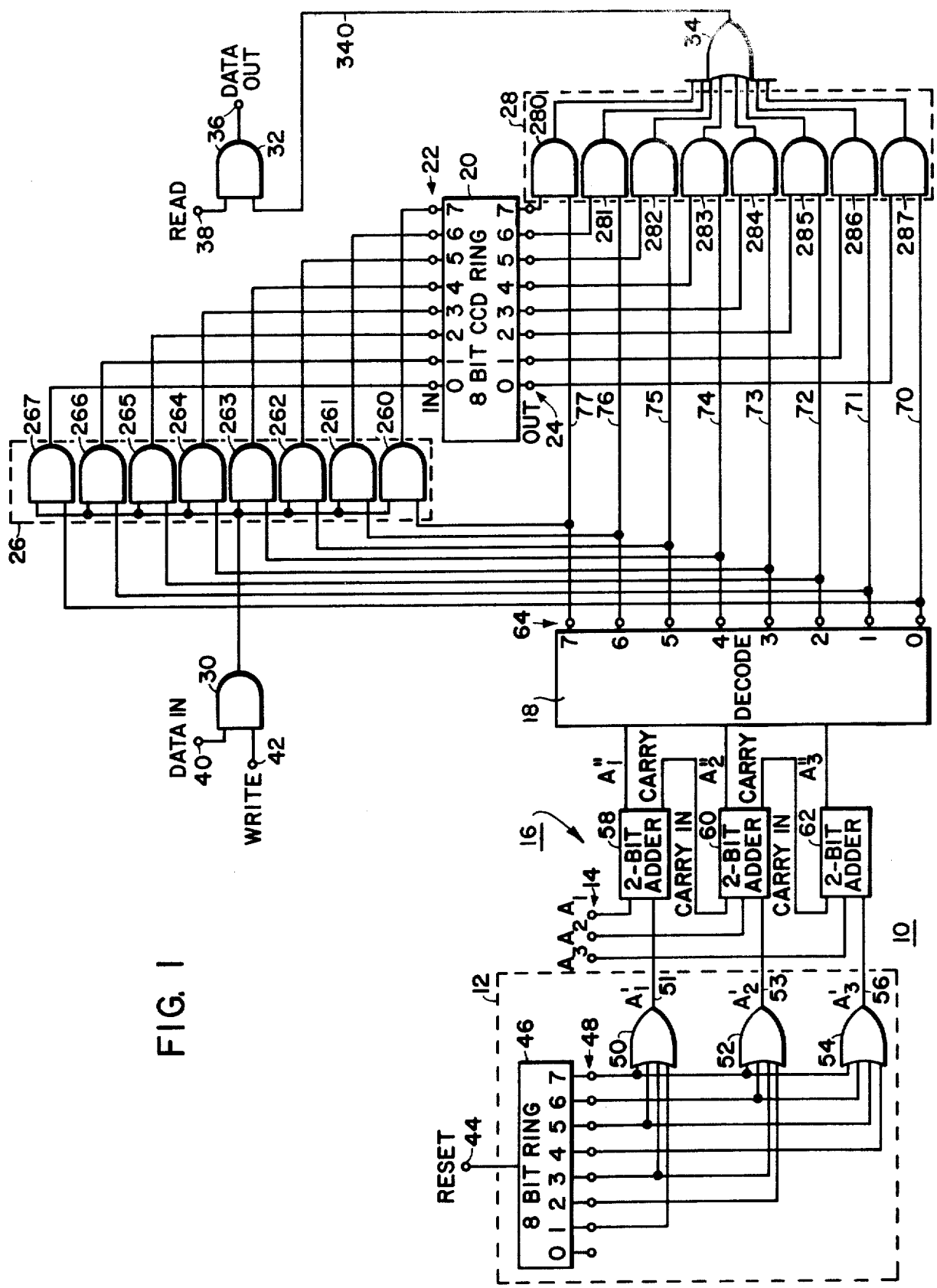
FIG. 1 is a schematic logic diagram of one embodiment of the invention, wherein a tap is associated with each storage cell of a ring of CCDs.

Referring to FIG. 1, random access memory (RAM) 10 includes an eight bit CCD (charge coupled device) ring, wherein eight adjacent CCD elements are coupled so as to recirculate information from bit seven back to bit zero. Means for regenerating the transferred charge packets are presumed to be included. CCD ring 20 includes eight input terminals (i.e.,) 22 and also eight output taps 24. Data can be written into the CCD cell associated with each tap for the input taps and information stored in a given CCD cell may be sensed or read out via the corresponding output tap. Structures for CCD cells and regeneration circuits are well known in the art.

An input tap such as any at the taps 22 will ordinarily be an input to a regeneration amplifier having a diffused region associated with a particular CCD cell as an input. The corresponding output tap is ordinarily the output of the same regeneration amplifier, which in turn acts as an input to the next CCD cell or string of cells.

RAM 10 also includes input and output circuitry associated with each of the input taps and output taps, respectively. The input circuitry includes a group 26 of two input AND gates 260–267, each having an output coupled to a respective one of the input taps 22. One input of each of the two input AND gates in group 26 is connected to the output of an input AND gate 30, having a Data input 40 and a write input 42 connected to its two inputs, respectively.

The AND and OR gates shown in the drawings in this disclosure could more accurately be referred to as AND-type or OR-type gates which may be either AND or NAND gates or OR or NOR-type gates. The important idea represented herein is that the AND-type gates produce the desired output signal when there is a coincidence of input logic levels at *all* of their inputs, whereas the OR-type gates produce the desired output signal when only one or more of the inputs have the same logic level thereat. These logic gates may be readily implemented utilizing any suitable technology, although the MOS technology is very suitable for integrated circuitry on the same semiconductor chip as the CCD elements. It should also be recognized that the rings described in this disclosure could be any sequential serially connected memory elements. The invention relates to the concept of an apparatus for randomly accessing a recirculating bit in a serially recirculating memory.

The output terminals 24 are all connected, respectively, to the corresponding inputs of a group 28 of AND-type gates 280–287. Each of the AND-type gates 280–287 has its output connected to an input of OR-type gate 34, having an output 340 connected to the input of an AND-type output gate 32 having its other input connected to read input 38 and having its output connected to data out terminal 36.

RAM 10 includes decoder 18 having eight outputs 64 coupled, respectively, to conductors 70–77, each of which is connected, respectively, to one input of AND-type gates 260–267 and 280–287. Decode circuit 18 can be readily implemented utilizing eight AND-type gates or any of a number of other well known techniques for combinational decoding. The inputs A1", A2", and A3" which are decoded by decoder 18 are generated by circuitry including counter 12 and adder circuitry 16. The function of the counter 12 and adder circuitry 16 in combination is to produce internally generated addresses A1', A2', and A3' on conductors 51, 53, and 56, respectively, which represent the position of an imaginary tag bit or reference bit which recirculates in CCD ring 20. Any type of counter which counts the binary combinations of a number of variables in increasing order and is reset by a reset conductor such as 44 is suitable. A very simple means of implementing such a counter is to utilize eight bit CCD ring 46, and utilize three OR-type gates 50, 52, and 54 to decode the eight binary combinations representing the positions of another tag bit recirculating in ring 46. Address inputs 14, comprising address input variables A1, A2, and A3, are utilized to access a particular bit of information recirculating in CCD ring 20. Obviously, the location of a bit of information in CCD ring 20 is not fixed, since it is a recirculating type of memory, as opposed to conventional RAMs in which flip-flops or dynamic memory devices of a fixed location are utilized to store information. The actual physical location of the addressed bit of information in CCD ring 20 is obtained by adding the internally generated address A1', A2', A3' to the address A1, A2, A3 to obtain a second internal address A1", A2", A3", which, as was mentioned earlier, is decoded by decoder 18. Clearly, the sum of A1, A2, A3 added to A1', A2', A3' produces the address of the actual physical location of the addressed bit of information, since counter 12 always adds the number of shifts that a tag bit would have shifted from a reference bit zero of CCD ring 20.

A number of variations on the theme of FIG. 1 can be made. First, a plurality of CCD rings can be utilized. Then, additional ring selection decoding circuitry needs to be added. Another modification can be made if slower access times are acceptable. The eight bit CCD ring 20 could be expanded to 64 bits but the number of taps could be left the same, so that only every eighth CCD cell has a tap and input/output circuitry associated with it. However, then it would be necessary, in order to access a given bit recirculating in the ring, to know how many times the bit would have to shift before it reached the next available tap so that the information in the cell could be sensed through that tap and the associated input/output circuitry at that time or be written into through the input/output circuitry at that time. In order to accomplish this it is necessary to add strobe circuitry which will keep track of the number of shifts necessary and generate an enable read/write enable pulse when the addressed bit appears at the next available tap.

Figure 2:
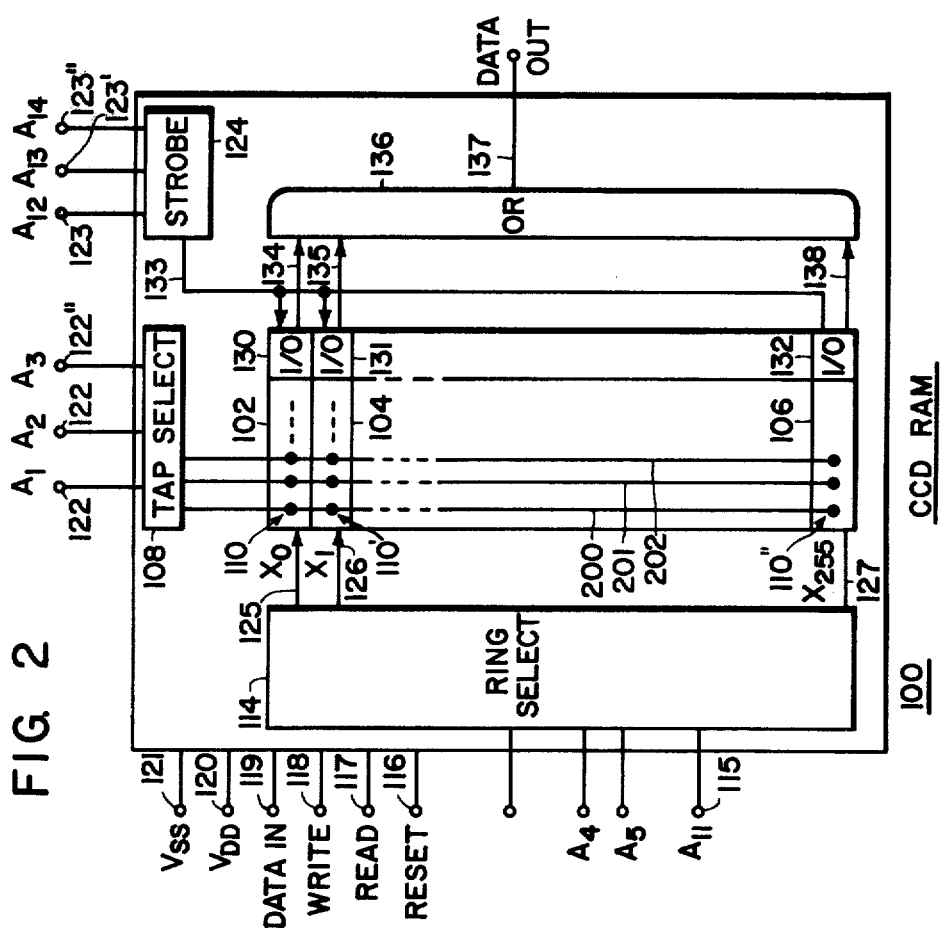
FIG. 2 is a block diagram of an expanded CCD RAM including a plurality of rings with spaced taps and means for addressing a recirculating bit.
Figure 5:
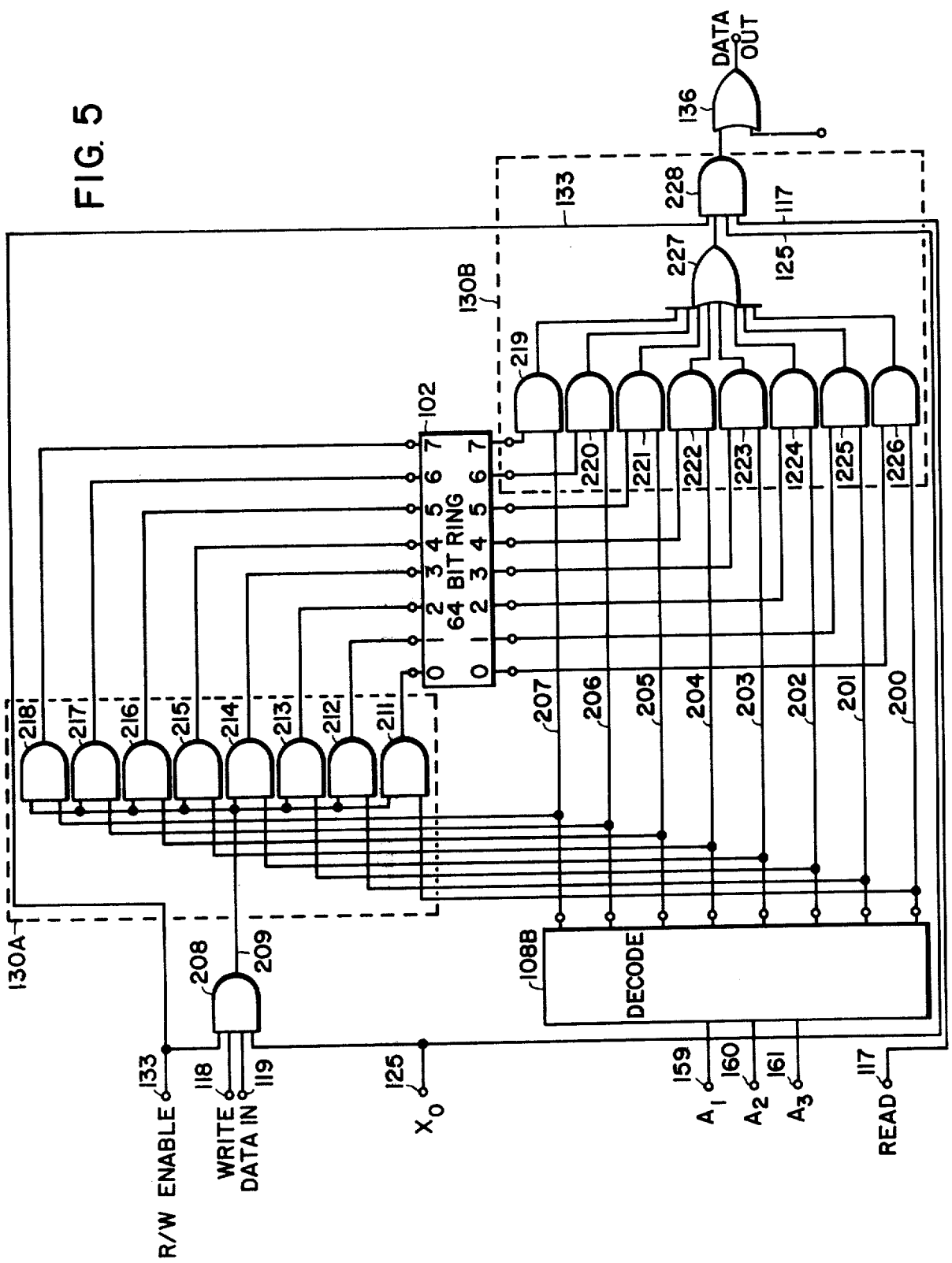
FIG. 5 is a logic diagram for the tap select circuitry of the embodiment of FIG. 2.

FIG. 2 shows a block diagram of a CCD RAM 100 incorporating the aforementioned additional features. RAM 100 includes 256 CCD rings such as 102, 104, 106 each analogous in structure to CCD ring 20 of FIG. 1 and each having 64 CCD bits, but only eight input taps and eight output taps. The taps are not designated as input taps or output taps in FIG. 2, and the input AND-type gates and output AND-type gates are not shown distinctly in FIG. 2; instead the taps and the AND-type gates are represented by the dots such as 110, 110' and 110" and by the I/O (input/output) circuitry 130, 131, 132 shown lumped at the ends of each ring. FIG. 5 shows the CCD ring 102 and the associated input and output circuitry more distinctly. The remaining rings and associated I/O circuitry 104, 131, 106, 132, etc. in FIG. 2 are all substantially similar to those shown in FIG. 5. The input/output circuits 130 in the associated terminals shown in FIG. 2 are selected by conductors 200, 201, 202 in FIG. 2 and by conductors 200 through 207 in FIG. 5. In FIG. 5, decode circuit 108B is merely part of tap select circuit 108 of RAM 100 in FIG. 2. Each chip requires only one decode circuit 108B, but requires an additional group of input gates such as 130A and output gates such as 130B for each 64 bit CCD ring.

It is seen that the CCD RAM 100 has 16,384 bits, requiring 14 address inputs A1–14 to address a single bit of information which is recirculating in one of the 256 rings. Ring selection is accomplished by ring select circuit 114, having inputs A4–A11 coupled thereto. The tap select input A1–A3 select the corresponding one of the eight taps of each of the 256 rings which will be reached next by the addressed circulating bit. The details of tap select circuit 108 are shown mostly in FIG. 3, except for the single decode gate 108B, which is shown in FIG. 5. Only one decode circuit 108B is required for RAM 100. Again, decode circuit 108B may be implemented by any suitable technique of combinational decoding, including use of eight AND or NAND gates and appropriate drivers. Ring select circuitry 114 may be implemented similarly, and need not be discussed further herein. Strobe circuit 124 can be implemented as shown in FIG. 4. The read/write enable output 133 of strobe circuit 124 is inputted to all of the input/output circuits 130, 131 . . . 132 to enable the input/output circuitry associated with the selected tap to write into or read out of the selected taps when the addressed bit reaches it. A 256 input OR-type gate 136 or functionally equivalent circuit produces the Data Out signal on conductor 137 representing the information associated with the addressed recirculating bit. Conductors 134–135 . . . 138 couple OR gate 136 to the respective output gates of the various rings.

Figure 3:
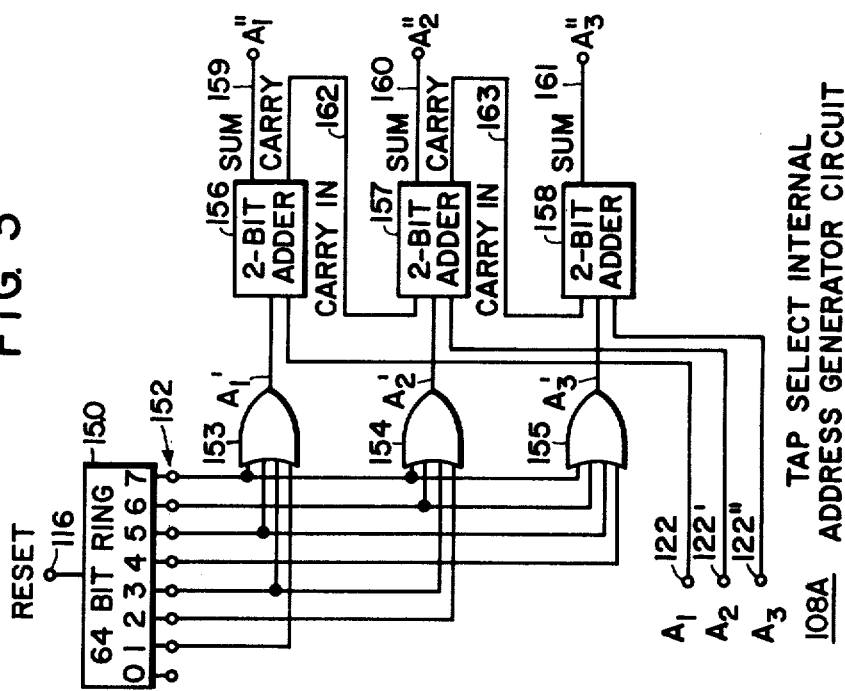
FIG. 3 is a schematic logic diagram of a tap select circuit for the embodiment of FIG. 2.
Figure 4:
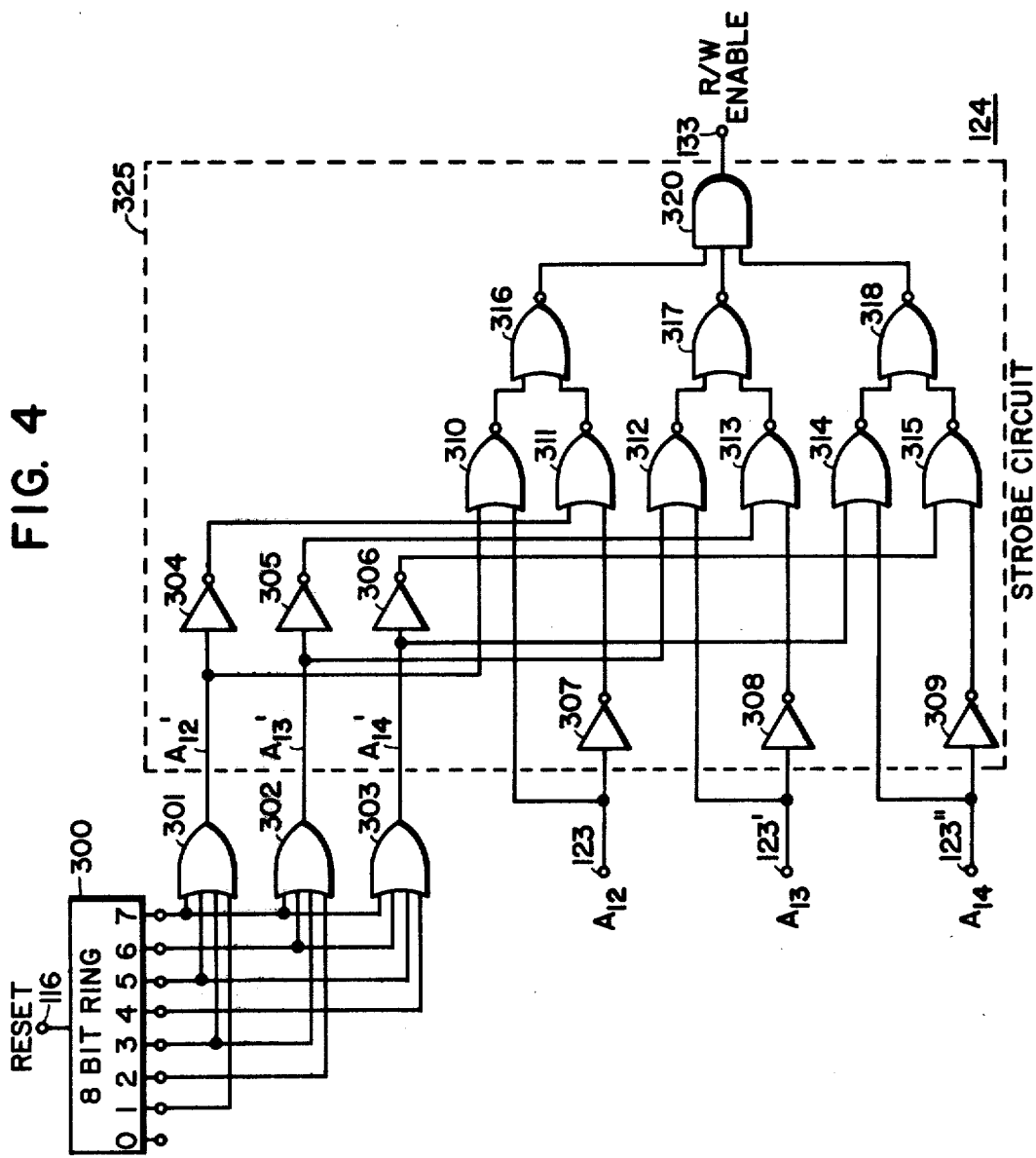
FIG. 4 is a schematic logic diagram of a strobe circuit for the embodiment of FIG. 2.

Referring to FIG. 3, the tap selection internal address generator circuit 108A, included within tap select circuitry 108 of FIG. 2, is shown. Circuit 108A includes a 64 bit CCD ring 150 resettable by means of reset input 116 and having eight equally spaced output taps 152. The output taps are decoded by OR-type gates 153, 154 and 155 to produce internally generated addresses A1', A2', A3' which count the binary sequence from 000 to 111 and represents the position of a fictitious tag bit recirculating or shifting from a reference bit in each of the CCD storage rings. It is seen that the internal address A1', A2', A3' represents the next tap which the address bit will reach. Address inputs A1, A2 and A3 are applied to conductors 122, 122' and 122" and represent the strobe address bits of the accessed bit, and are inputted respectively, to two bit adder circuits 156, 157, and 158. The other inputs of the two bit adder circuits are connected, respectively, to the outputs of OR-type gates 153, 154, and 155. The carry outputs of two bit adder 156 is connected to the Carry In input of two bit adder 157, which has its Carry Out bit inputted to the Carry In input bit of two bit adder 158. The Sum bits of each of the three two bit adders are connected to conductors 159, 160, and 161, where internal address A1", A2", A3" is generated. The internal address A1", A2", A3" represents the sum of the externally applied tap select address bits and the actual physical location of the fictitious tag bit A1', A2', A3'. The address A1", A2" A3" is decoded by decoder 108B in FIG. 5, the outputs of which are applied so as to select the next tap at which the address bit will appear.

The input and output circuitry shown in FIG. 5 is somewhat similar to that previously described and shown in FIG. 1. The eight two input AND-type gates 211-218 have their outputs connected to the eight taps 0-7 of 64 bit ring 102. One input of each of the gates 211-218 is connected to the output of AND-type gate 208, which has as inputs a read/write enable (or strobe) pulse applied to conductor 133 and generated by the strobe circuit 124 in FIG. 4. The Data In conductor 119 and the Write conductor 118 and the ring select conductor 125 are also provided as inputs to AND-type gate 208. Similarly, a group of gates 219-226, all being two input AND-type gates, each gate having a respective input connected to taps 0-7 of 64 bit ring 102 and each having an output connected to an input of OR-type gate 227, are provided. The output of OR-type gate 227 is connected to an input of AND-type gate 228, which has read/write enable conductor 133, read conductor 117 and ring select conductor 125 as inputs. Each of the output circuits of the respective 256 rings are connected to a respective input of OR-type gate 136, as mentioned above. Each of the two input AND-type gates in 130A and circuitry 130B are selected by conductors 200-207, the outputs of tap decode circuit 108B.

Referring to FIG. 4, strobe circuit 124 includes a counter circuit including eight bit CCD ring 300 and OR-type gate 301, 302, 303. The rest of the circuitry in strobe circuit 124 is included in compare circuit 325. Eight bit CCD ring 300 has eight taps 0-7 which are decoded by gates 301, 302, and 303 to produce an internal address A12', A13', A14' which represents the relative position between any two consecutive taps of the 64 bit CCD rings in RAM 100 of the aforementioned fictitious tag bit. Address inputs A12, A13, and A14 are the external address bits which enable the read/write enable strobe pulse to be generated. The read/write enable strobe pulse is generated when the fictitious tag bit has undergone the number of shifts from the position at which it was physically located when the addressed bit was addressed by the input combination A1-A14 to the next selected tap. Comparison circuit 325 accomplishes this by generating the read/write enable pulse when $\overline{A12'}$, $\overline{A13'}$, $\overline{A14'}$ is equal to A12, A13, A14.

It is seen that the outputs of the OR-type gates 301, 302, and 303 are connected, respectively, to inputs of inverters 304, 305, and 306 and to inputs of OR-type gates 310, 312, and 314. The other inputs of OR-type gates 310, 312 and 314 are connected, respectively, to A12, A13, and A14. The outputs of inverters 304, 305, and 306 are connected, respectively, to inputs of OR-type gates 311, 313, and 315, the other inputs of which are connected, respectively, to the outputs of inverters 307, 308, and 309, which in turn have their inputs connected, respectively, to A12, A13, and A14. The outputs of NOR gates 310 and 311 are connected to the intputs of NOR gate 316. The outputs of NOR gates 312 and 313 are connected to the inputs of NOR gate 317. The outputs of NOR gates 314 and 315 are connected to the inputs of NOR gate 318. The outputs of NOR gates 316, 317, and 318 are connected, respectively, to inputs of AND-type gate 320, whose output is conductor 133, on which the read/write enable signal is developed.

In FIG. 1, even though the data in ring 20 is recirculating, every bit can be randomly accessed. In essence, this is accomplished by first generating an internal address A1', A2', A3' by decoding a comparable eight bit ring 46 which is initially reset so that a fictitious tag bit starts at position zero, shifts one bit location at a time to position 7 and recirculates or is set back to position zero. The decode gates 50, 52, and 54 decode the last seven outputs of the counter to generate the following truth table.

| TAG BIT POSITION | A3', | A2' | A1' |
|---|---|---|---|
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

As an example, assume that we want to write information into the CCD ring. Also assume that at that time the position of the tag bit in counter ring 46 happens to be at position 2. This corresponds to address A3', A2', A1' having the digital value 010, from the above table. Assume that the address inputted to the memory, A3, A2, A1 has the digital value 111. The physical location A3", A2", A1" of CCD ring 20 into which the data would be written is obtained by adding A3', A2', A1' to A3, A2, A1 by means of adder circuitry 16 yielding the following result:

$$\begin{array}{r} 010\ (A3',\ A2',\ A1') \\ +\ 111\ (A3,\ A2,\ A1) \\ \hline 001\ (A3'',\ A2'',\ A1'') \end{array}$$

Next, assume that, three clock pulses later we wish to read the data out of the memory. The tag bit will have moved three positions in counter ring 46 and all of the data in CCD ring 20 will have shifted three positions. The address A3', A2', A1' will have moved from position 2 to position 5. Therefore its address A3', A2', A1' will be 101. The data we wish to access is once again addressed as A3, A2, A1 equal to 111. The physical location in which the addressed bit is now located is determined by adding A3, A2, A1 to A3', A2', A1 by adder circuitry 16 as follows:

$$\begin{array}{r} 101\ (A3',\ A2',\ A1') \\ +\ 111\ (A3,\ A2,\ A1) \\ \hline 100\ (A3'',\ A2'',\ A1'') \end{array}$$

Therefore, the addressed bit is at position 4 in ring 20, so we would read out of position 4 in ring 20 the same data that we wrote in during the previous write operation.

The ring select decoder of FIG. 2 operates in a completely conventional manner the same as ordinary combinational decoding circuits, and the operation will not be described herein.

The operation of the tap select circuit of FIG. 3 is identical to the operation just described with respect to FIG. 1. In FIG. 1, a read memory bit has a tap associated with it, and therefore the decoding circuitry in FIG. 1 is essentially a tap select circuit. In FIG. 3, ring counter 150 has 64 bits, but only 8 taps. The operation of the circuitry in FIG. 3 merely operates to generate the internal address A3', A2', A1' of one of the taps of each ring in exactly the same fashion as the circuit in FIG. 1, and therefore will not be described. However, in the embodiment in FIGS. 2-5, merely addressing the ring in which the addressed bit is located and selecting the next tap which it (the address bit) will reach does not completely identify and access the addressed bit. The circuitry of FIG. 4 generates a read/write enable or strobe pulse to the input-output circuitry associated with the selected tap when the addressed bit of information reaches the selected tap.

The address comparison circuit in FIG. 4 operates so that a read/write enable pulse is developed on node 133 when there are three "1's" on the inputs of AND gate 320. This can only occur when the inputs of NOR gates 316, 317 and 318 are all low. This condition can only occur when a A14, A13, A12 is equal to $\overline{A14'}$, $\overline{A13'}$, $\overline{A12'}$. However, any other address comparison circuit which would provide only one read/write enable pulse at a different time for each of the eight combinations of A14, A13, and A12 would work equally well.

It will be apparent to those skilled in the art that the disclosed Recirculating Memory With Plural Input-Output Taps may be modified in numerous ways and may assume many embodiments other than the preferred form specifically set out and described above. Accordingly, it is intended by the appended claims to cover all modifications of the invention which fall within the true spirit and scope of the invention.

What is claimed is:

1. A memory comprising:
   memory means including a plurality of sequentially coupled storage cells for recirculating data, one of said storage cells being a reference storage cell;
   address means for addressing any particular bit of data recirculating in said memory means;
   first means coupled to said address means and said memory means for counting the number of said memory cells through which said addressed bit has shifted relative to said reference storage cell and combining said number with an address representing the location of the storage cell where said addressed bit was initially stored to produce an internal address corresponding to the actual location of said addressed bit of recirculating data; and
   decode means coupled to said plurality of storage cells and to said first means for selecting said actual location.

2. The memory as recited in claim 1 further including second means coupling said storage cells to said decode means for writing new information into said actual location during a write operation and sensing said bit of data during a read operation.

3. The memory as recited in claim 2 wherein said first means includes counter means for counting said number of shifts, and combining means coupled to said counter means and said decode means and said address means for performing said combining, and reset means for resetting said counter means when said bit of recirculating data is in said reference storage cell.

4. The memory as recited in claim 2 wherein said counter means comprises a recirculating memory having a plurality of outputs and a plurality of logic gate means coupled to said plurality of outputs and to said combining means for generating a binary number equal to said number of shifts.

5. The memory as recited in claim 4 wherein said combining means comprises a plurality of two-input adders coupled to said logic gate means, to a plurality of address inputs, and to said decode means.

6. The memory as recited in claim 5 wherein said storage cells are charge coupled devices, and wherein said recirculating memory in said counter means is comprised of charge coupled devices.

7. In a memory including recirculating memory means including a plurality of storage cells and address means for addressing any particular bit of data recirculating in said memory means, an improvement comprising a reference storage cell in said recirculating memory means and means electrically coupled to said address means and said recirculating memory means for determining the number of said memory cells through which an addressed bit has shifted relative to said reference storage cell and combining said number with said address and for decoding the result to select the physical location of said addressed bit in said recirculating memory means.

8. A memory comprising:
   memory means including a plurality of sequentially coupled storage cells for recirculating data therein;
   a first one of said storage cells and a second one of said storage cells being spaced from each other by a plurality of intervening storage cells;
   each of said first and second storage cells having respective first and second input-output means coupled thereto for entering data into or sensing data in said first and second storage cells, respectively;
   address means for addressing any particular bit of data recirculating in said memory means; and
   first means coupled to said address means and said input-output means for generating an enable signal when said addressed bit is temporarily stored in said second storage cell.

9. The memory as recited in claim 8 wherein said enable signal enables said second input-output to enter data into said second storage cell or to sense data in said second storage cell.

10. The memory as recited in claim 9 wherein said first means includes logic means for determining the number of shifts said addressed bit must undergo before said addressed bit is located in said second storage cell.

11. The memory as recited in claim 10 wherein said logic means includes:
    counter means for counting the number of said storage cells from said first storage cell to and including said second storage cell and generating a variable number which increases at the same rate as the rate at which data shifts in said recirculating memory means; and
    comparison means coupled to said counter means and said address means for comparing said variable number and said address of said addressed bit, and generating said enable signal in response to said comparison.

12. The memory as recited in claim 11 wherein said comparison means generates said enable signal when said variable number is equal to said address.

13. A memory comprising:
    memory means including a plurality of sequentially coupled storage cells for recirculating data therein;
    one of said storage cells being a reference storage cell;
    address means for addressing any particular bit of data recirculating in said memory means;
    first, second, and third ones of said storage cells being spaced from each other by a plurality of intervening storage cells;
    each of said first, second, and third storage cells having respective first, second, and third input-output means coupled thereto for entering data into or sensing data in said first and second storage cells, respectively;

said address means including first means coupled to said first, second, and third input-output means for selecting the most recent one of said first and second storage cells in which said addressed bit has been temporarily stored; and means coupled to said address means and said first, second, and third input-output means for generating an enable signal when said addressed bit is temporarily stored in the one of said second and third storage cells sequentially nearest said most recent one of said first and second storage cells.

14. A memory comprising:

a plurality of memory means each including a plurality of sequentially coupled storage cells for recirculating data therein;

one of said storage cells in each of said memory means being a reference storage cell;

address means for addressing any particular bit of data recirculating in any of said memory means;

first, second, and third ones of said storage cells in each of said memory means being spaced from each other by a plurality of intervening storage cells;

each of said first, second, and third storage cells in each of said memory means having respective first, second, and third input-output means coupled thereto for entering data into or sensing data in said first and second storage cells, respectively;

said address means including first means coupled to said first, second, and third input-output means in each of said memory means for selecting the most recent one of said first and second storage cells in which said addressed bit has been temporarily stored;

means coupled to said address means and said first, second, and third input-output means in each of said memory means for generating an enable signal when said addressed bit is temporarily stored in the one of said second and third storage cells sequentially nearest said most recent one of said first and second storage cells; and said address means including second means for selecting one of said memory means by enabling said input-output means of said selected memory means.

15. A method of addressing any particular bit of a memory including a recirculating memory, said recirculating memory including a plurality of memory cells connected in series and each having input-output means associated therewith said method comprising the steps of:

applying a binary address corresponding to said bit to said memory;

counting the number of said memory cells through which said addressed bit has shifted from a reference memory cell of said recirculating memory;

adding said number to said binary address to obtain a binary number corresponding to the temporary location of said bit; and decoding said binary number to obtain a select signal for selecting said temporary location.

16. The method as recited in claim 15 wherein each of said memory cells is separated from another of said counted memory cells by a plurality of intervening memory cells, said method also including the steps of:

counting the number of said intervening storage cells between said storage cells having said associated input-output means and generating a variable number which increases at the same rate as the rate at which data shifts through said recirculating memory;

comparing said variable number to said address of said addressed bit;

generating an enable signal at the time said addressed bit is shifted into the subsequent storage cell having associated input-output means in response to results of said comparison; and applying said enable signal to said input-output means associated with said subsequent storage cell.

* * * * *